(12) United States Patent
Biro et al.

(10) Patent No.: US 7,455,880 B2
(45) Date of Patent: Nov. 25, 2008

(54) OPTICAL ELEMENT FABRICATION METHOD, OPTICAL ELEMENT, EXPOSURE APPARATUS, DEVICE FABRICATION METHOD

(75) Inventors: Ryuji Biro, Kanagawa (JP); Minoru Otani, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 96 days.

(21) Appl. No.: 11/212,574

(22) Filed: Aug. 29, 2005

(65) Prior Publication Data

US 2005/0287292 A1  Dec. 29, 2005

Related U.S. Application Data

(62) Division of application No. 10/303,295, filed on Nov. 25, 2002, now abandoned.

(30) Foreign Application Priority Data

Nov. 26, 2001 (JP) ............................. 2001/359618

(51) Int. Cl.
*B05D 5/00* (2006.01)
(52) U.S. Cl. .................. 427/162; 427/165; 427/166; 427/554; 427/158; 427/596
(58) Field of Classification Search .................. 427/162, 427/164–166, 553–554, 158, 595, 596; 359/558, 359/576, 642; 250/492.1
See application file for complete search history.

(56) References Cited

U.S. PATENT DOCUMENTS

| | | | |
|---|---|---|---|
| 4,608,272 A | 8/1986 | Rowe et al. | |
| 4,641,033 A | 2/1987 | Petelin et al. | |
| 5,472,748 A | 12/1995 | Wolfe et al. | |
| 5,581,499 A * | 12/1996 | Hamamdjian | 365/106 |
| 5,780,120 A * | 7/1998 | Belouet et al. | 427/554 |
| 5,796,458 A | 8/1998 | Koike et al. | |
| 5,814,257 A | 9/1998 | Kawata et al. | |
| 6,037,270 A | 3/2000 | Kageyama et al. | |
| 6,261,696 B1 | 7/2001 | Biro et al. | |
| 6,508,990 B1 * | 1/2003 | Yoshida et al. | 422/186.05 |
| 6,544,914 B1 | 4/2003 | Kikugawa et al. | |
| 2002/0005990 A1 | 1/2002 | Watanabe | |

FOREIGN PATENT DOCUMENTS

| | | |
|---|---|---|
| EP | 0375534 | 6/1990 |
| EP | 1134303 | 9/2001 |
| EP | 1230989 | 8/2002 |
| JP | 60204640 | 10/1985 |
| JP | 7294705 | 11/1995 |
| JP | 09-324262 | 12/1997 |
| JP | 2000-150343 | 5/2000 |
| JP | 2001-290001 | 10/2001 |

OTHER PUBLICATIONS

D.A. Ma et al. "Optical Bleaching in Situ for Barium Floride Crystals", Nuclear Instruments & Methods in Physics Research, 1995, pp. 309-318.

* cited by examiner

*Primary Examiner*—Alain L Bashore
(74) *Attorney, Agent, or Firm*—Morgan & Finnegan, LLP

(57) ABSTRACT

There is to provide an optical element fabrication method including the steps of forming a thin film onto a substrate, and eliminating a color center produced in the forming step by giving energy to the substrate.

11 Claims, 4 Drawing Sheets

OPTICAL ELEMENT FABRICATION METHOD, OPTICAL ELEMENT, EXPOSURE APPARATUS, DEVICE FABRICATION METHOD

CROSS-REFERENCE TO RELATED APPLICATIONS

This application is a divisional of U.S. application Ser. No. 10/303,295 filed Nov. 25, 2002, now abandoned, which claims priority from Japanese Patent Application No. 2001-359618 filed on Nov. 26, 2001, the entire contents of all of which are hereby incorporated by reference as if fully set forth herein.

BACKGROUND OF THE INVENTION

The present invention generally relates to optical element fabrication methods, and more particularly to a fabrication method for a transmission type optical element including a thin film. The present invention is suitably applicable for fabricating fluoride crystal materials such as calcium fluoride, magnesium fluoride, etc. suitable for various kinds of optical elements, lenses, window materials, prisms, etc. employed in a wide wavelength range, e.g., from the vacuum ultraviolet region to the far-infrared region.

Fluoride crystal has distinguished characteristics, which other optical materials do not have, such as less dispersion for white light, high transmittance for light having a wavelength shorter than the ultraviolet region, etc., thus having been so far used for a telescope lens with high resolution and low aberration. Recently, applications to a lens in an illumination optical system and a projection optical system in an exposure apparatus have been reviewed which uses, for a light source, light with a shorter wavelength such as KrF excimer laser with a wavelength of about 248 nm, ArF excimer laser with a wavelength of about 193 nm, $F_2$ excimer laser with a wavelength of about 157 nm, etc. However, the shorter the wavelength becomes, the larger light's absorption, diffusion, and interference become, and thus, along with a shorter wavelength of light from a light source, the reflection of light on the surface of an optical element such as a lens and a mirror cannot be neglected.

In general, in an attempt to use an optical substrate for an optical system, anti-reflection film coating is widely applied onto an optical element for the purpose of increasing the transmittance of the optical element by decreasing its reflectance, and for the purpose of removing flare and ghost caused by the surface reflection of the optical system.

An optical thin film design defines a configuration of the anti-reflection film. Dielectric of an oxide or fluoride substance is used for a film material. As a manufacturing method of the anti-reflection film, there are a sputtering process that collides ion in plasma against a target surface so as to drive out target atoms to form a desired thin film onto a substrate by colliding, a chemical vapor deposition ("CVD") method that uses a chemical reaction in a high-temperature space or space activated by plasma, light, etc. to form a desired thin film, a vacuum evaporation method that heats and evaporates a thin film substance using an electron beam and a heater, and so on to form a desired thin film onto a substrate.

However, if a thin film is formed onto a substrate by using the sputtering and CVD methods that use plasma, and by the vacuum evaporation method that uses an electron gun, an electric potential difference is produced among ion, electron and the substrate, and the ion and electron breaks into the substrate, thus damaging the substrate and the thin film formed on the substrate.

This damage would change a compositional ratio of chemical compounds, and impair crystallization, thereby deteriorating optical characteristics of an optical element. This damage includes generation of optical absorption (the so-called color center that absorbs light). For example, when calcium fluoride is used as a substrate, it is structured by electric coupling of $Ca^{2+}$ and $F^-$ since calcium fluoride is an ionic crystal. Here, assuming $F^-$ is missing, and it is in an electrically unstable and high-temperature state, $e^-$ (electron) would occupy the place that lacks $F^-$ for electric stability, thereby producing the optical absorption. Then, although it is electrically stable, it is hard for light to transmit it, thus reducing its transmittance. In particular, optical absorption is noticeably observed in a light wavelength range equal to or shorter than 300 nm, thus presenting the problem that a transmission type optical element reduces its transmittance, being unable to obtain expected optical characteristics. This color center is inclined to appear when an ionically coupled substance is used for a substrate or as a material for a thin film.

BRIEF SUMMARY OF THE INVENTION

Accordingly, it is an exemplified object of the present invention to provide an optical element fabrication method, exposure apparatus, device fabrication method, and devices, the fabrication method that can reduce an optical absorption produced when a thin film is fabricated on a substrate and can fabricate an optical element having excellent optical characteristics. The present invention is especially effective when the substrate includes fluoride crystal(s).

An optical element fabrication method as an aspect of the present invention includes the steps of forming a thin film onto a substrate and eliminating a color center produced in the forming step by irradiating light to the substrate. The substrate may contain fluoride as its ingredient. The fluoride may include, e.g., calcium fluoride. However, the present invention does not exclude other materials such as potassium fluoride, magnesium fluoride, barium fluoride, etc. The irradiating step may irradiate the light from a low pressure mercury lamp. Thereby, irradiation of light in the ultraviolet region can decrease the color center more than irradiating light in the visible range to the optical element. The irradiating step may irradiate light from a laser light source. Thereby, it is possible to irradiate KrF excimer laser, ArF excimer laser; F 2 excimer laser, etc., thus further reducing color center. The irradiating step may set the light intensity of the light to be 0.02 mJ/cm$^2$ or higher. The irradiating step may set an irradiation time of the light to be five minutes or longer. The irradiating step may set a product of the light intensity of the light and the irradiation time of the light to be 0.1 mJ·minutes/cm$^2$ or more. The forming step may form the thin film in an atmosphere including plasma. The forming step may use electron beam heating to form the thin film.

An optical element fabrication method as another aspect of the present invention includes the steps of forming a thin film onto a substrate, and eliminating a color center produced in the forming step by giving energy to the substrate.

An optical element as still another aspect of the present invention is fabricated by the above fabrication method. Such an optical element may include a lens, a multi-lens, a lens array, a lenticular lens, a fly-eye lens, an aspheric lens, a diffraction grating, a binary optics element, and a complex thereof.

An exposure apparatus as still another aspect of the present invention irradiates exposure light to an object to be exposed via an optical system including the above optical element, and exposes the object. The exposure light may have a wavelength range being 300 nm or less. However, the present invention does not exclude use of exposure light having a wavelength range of 300 nm or higher.

A device fabrication method as still another aspect of the present invention includes the steps of exposing an object to be exposed by using the above exposure apparatus, and performing a specified process for the exposed object. Claims for the device fabrication method that exhibits operations similar to those of the above exposure apparatus cover devices as their intermediate products and finished products. Moreover, such devices include semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

As a result of assiduous studies of methods for recovering an optical element's decreased transmittance (or removing a color center) due to optical absorption after a thin (anti-reflection) film has been formed onto a fluoride substrate by use of the sputtering method, CVD method, and the vacuum evaporation method, the present inventors have discovered that it is effective to irradiate light after the anti-reflection film has been formed.

The present embodiment irradiates light and attempts to eliminate optical absorption produced in a substrate when a thin film is created onto the substrate.

Energy irradiation would repair the above-mentioned impairment generated in the substrate in such a way as atom-to-atom re-coupling, re-arrangement of atoms between lattices, etc. The applicable energy can be thermal energy, but the thermal energy extricates gas atoms in a compound from a substance, thus possibly causing optical absorption conversely. On the other hand, optical energy can be more effective energy since it does not exert any evil influence as is caused by thermal energy. Especially, use of a light source that emits light in the ultraviolet region as from a low-pressure mercury lamp rather than a halogen lamp, etc. that emit visible radiation is more effective in reducing optical absorption since its light energy is large. Laser beams, especially KrF excimer laser, ArF excimer laser, $F_2$ excimer laser, etc. with a wavelength of 300 nm or less are also highly effective in reducing optical absorption.

Figure 1:
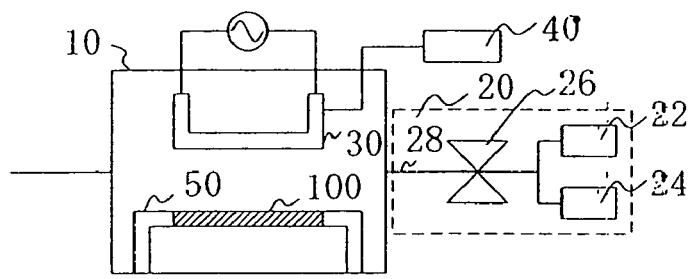
FIG. 1 is a schematic sectional view of an optical irradiation apparatus as one aspect of the present invention.

Referring to accompanying drawings, a description will be given below of an optical irradiation apparatus 1 as an exemplified aspect of the present invention. Here, FIG. 1 is a schematic sectional view of the optical irradiation apparatus 1 of the present invention. The optical irradiation apparatus 1 irradiates light onto an optical element after a thin film has been formed onto it, thus repairing the damage it received when the thin film was formed. As shown in FIG. 1, the optical irradiation apparatus 1 includes a chamber 10, a gas introducer 20, an irradiating section 30, a controller 40 and a substrate holder 50. The optical irradiation apparatus 1 of the present embodiment is especially effective when it is used to reduce optical absorption (in other words, to recover transmittance) after an anti-reflection film including a fluoride crystal such as calcium fluoride, and the like is formed onto the optical element. However, the optical irradiation apparatus 1 is not limited to these embodiments, but each of its components may be replaced within a scope that may achieve the object of the present invention.

For the chamber 10, its sidewall and bottom include conductors, e.g., such as aluminum and the like, and its inner part is shut off from the open air, thus being kept in a specified atmosphere. The specified atmosphere is, e.g., air, oxygen, nitrogen, an inert gas and a mixture thereof. In particular, when ultraviolet light is irradiated to the substrate 100 (i.e., the optical element) by the irradiating section 30 described later while keeping the chamber 10 in an atmosphere including oxygen, the ultraviolet light will generate activated oxygen in the oxygen gas, thus activating an organic material which is a contaminant clinging to the surface of the substrate 100. From the activated oxygen and oxygen molecules, ozone is generated, which upon receiving ultraviolet light, changes into excited activated oxygen, decomposing and volatilizing organic substance. After that, the chamber 10 supplies any one of the above gases for some time via the gas introducer 20 described later, or e.g., purges (exhausts) harmful gases such as ozone and the like through a gas exhauster (not shown) having a stainless gas exhaust pipe connected to the chamber 10. The gas exhauster has an ozone decomposing filter (not shown) for decomposing ozone to be discharged out via the gas exhaust pipe. The chamber 10 is provided with the irradiating section 30 at its top, and with the gas introducer 20 at its side, but such a structure is exemplary, and of course, it is not limited to such a structure.

The gas introducer 20 includes an oxygen cylinder 22, a nitrogen cylinder 24, a valve (or an on-off valve) 26, and, e.g., a stainless gas supply pipe 28. The gas introducer 20 is connected to the gas supply pipe 28, and is connected to the chamber 10 via a gas supply nozzle (not shown) of, e.g., quartz pipe make. The gas introducer 20 further includes a mass flow controller (not shown) that controls the flow of oxygen and nitrogen, and a filter that eliminates particles and organic matters contained in the oxygen and nitrogen to be introduced. Alternatively, the gas introducer 20 may supply the chamber 10 with air or inert gas in place of oxygen and nitrogen.

The oxygen cylinder 22 supplies clean oxygen to the inside of the chamber 10. Oxygen has a Herzberg's absorption band per 190 nm~240 nm, and reacts to ultraviolet light, generating ozone and activated oxygen. As mentioned above, ozone and activated oxygen accelerates oxidative destruction of contaminants such as an organic matter. The gas introducer 20 may introduce ozone in place of oxygen.

The nitrogen cylinder 24 supplies pure nitrogen to the inner part of the chamber 10. Nitrogen, e.g., is supplied at room-temperature and in low humidity.

The valve 26 is installed at an arbitrary position on the gas supply pipe 28, and switches on and off the supply of gas to the chamber 10 from the oxygen cylinder 22 and nitrogen cylinder 24 in common.

The irradiating section 30 uses, e.g., one or more low-pressure mercury lamps as a light source. A low-pressure mercury lamp can usually emit light in the ultraviolet region. However, a light source to be used for the irradiating section 30 is not limited to a low-pressure mercury lamp. For example, ArF excimer laser, KrF excimer laser, $F_2$ excimer laser, etc. all with a wavelength of 300 nm or less can be used, and a halogen lamp and the like emitting visible radiation can also be used. Also, it does not limit the number of laser units.

The controller 40 is connected to the irradiating section 30, thus controlling irradiation of light from the irradiating section 30. The controller 40 controls the intensity of irradiated light, irradiation time, etc. based on the material of the substrate 100 to be irradiated, and the thickness and material of the thin film (anti-reflection film) formed on the substrate 100. The irradiation time differs depending on the amount of optical absorption, but normally, optical irradiation continues until there is no more change in the amount of optical absorption relative to the irradiation time. For example, it would be effective if the intensity of illumination is 0.02 mJ/cm$^2$ or more, the irradiation time is 5 minutes or longer, and a product of the intensity and the irradiation time is 0.1 mJ·minutes/cm$^2$ or more.

One pair of substrate holders 50 are provided in FIG. 1, but the number of the holders is not limited. The substrate holder 50 supports the substrate 100 such that the face on which the thin film is formed is faced toward the irradiating section 30, but how to support it, needless to say, does not matter. Any structure known in the art can be applied, and thus a detailed description thereof will be omitted.

Formed on the substrate 100 is a thin film (an anti-reflection film, e.g., silicon oxide, and magnesium fluoride). The substrate 100 in this embodiment includes fluoride crystals (e.g., calcium fluoride, magnesium fluoride, barium fluoride, etc.), and the thin film is formed by sputtering and CVD utilizing plasma, the vacuum disposition using an electron gun, etc. A provision of an anti-reflection film would be able to control reflectance, and enhance transmittance, of p and s polarization light, e.g., near a perpendicular incident angle, as well as eliminating flare and ghost caused by surface reflection.

In operation, the substrate 100 is set at the substrate holders 50 at first, and the surface on which the thin film of the substrate 100 is formed is located below the irradiating section 30. Then, the inner part of the chamber 10 is purged by the gas exhauster (not shown), as well as supplying gas (such as oxygen, nitrogen, inert gas, etc.) via the gas introducer 20 to keep the chamber 10 in a desired atmosphere. The controller 40 controls the irradiating section 30 based on the material of the substrate 100, and the thickness and material of the thin film formed on the substrate 100, thus letting the irradiating section 30 irradiate the substrate 100 with a given intensity and for a given period.

A provision of a thin film forming apparatus with the above mentioned functions of the optical irradiation apparatus as an exemplified aspect of the present invention makes it possible to alleviate work to transfer the substrate from the thin film forming apparatus to the optical irradiation apparatus, and prevent dust and the like from clinging to the substrate at the time of the transfer.

The present inventor irradiated substrates, to which many kinds of thin films have been formed, by changing the substrate 100, materials and formation methods for the thin film, kinds of irradiated light and irradiation periods, measured optical characteristics (transmittance and reflectance), and calculated optical absorption.

EXAMPLE 1

First of all, a thin film of silicon oxide ("SiO$_2$") with a thickness of about 100 nm was formed by sputtering onto a flat calcium fluoride ("CaF$_2$") substrate with a thickness of 2 mm, both of whose surfaces are polished to be used as the substrate 100. As soon as the thin film was formed, the transmittance and reflectance of this optical element was measured using a spectrophotometer to calculate an optical absorption factor.

Next, this optical element was irradiated by the light from a low-pressure mercury lamp for two hours (where it is assumed that the irradiating section 30 of the optical irradiation apparatus 1 is a low-pressure mercury lamp). After this optical element was irradiated by the light from the low-pressure mercury lamp, its transmittance and reflectance was measured again by using the spectrophotometer to calculate the optical absorption factor.

The calculation result of the optical absorption factor at the wavelength of 193 nm from the measured transmittance and reflectance was 2.1% right after the thin film was formed, while on the other hand it was reduced to be as much as 0.1% after the thin film was irradiated by the low-pressure mercury lamp. From the above, it can be understood that if an optical element is irradiated by a low-pressure lamp after a thin film has been formed onto it, its optical absorption factor will be reduced. In other words, irradiation of the optical element including calcium fluoride by a low-pressure mercury lamp, which was damaged (a color center was produced) when a silicon oxide thin film was formed by using the sputtering process, and whose transmittance lowered, is effective in recovering its transmittance.

EXAMPLE 2

At first, a thin film of magnesium fluoride ("MgF$_2$") with a thickness of about 100 nm was formed by vaporizing the magnesium fluoride while heating it with an electron beam, onto a flat CaF$_2$ substrate with a thickness of 2 mm, both of whose surfaces are polished to be used as the substrate 100. As soon as the thin film was formed, the transmittance and reflectance of this optical element was measured using a spectrophotometer to calculate an optical absorption factor.

Next, this optical element was irradiated by a low-pressure mercury lamp for one hour (where it is assumed that the irradiating section 30 of the optical irradiation apparatus 1 is a low-pressure mercury lamp). After this optical element was irradiated by the low-pressure mercury lamp, its transmittance and reflectance was measured again by using the spectrophotometer to calculate its optical absorption factor.

The calculation result of the optical absorption factor at the wavelength of 248 nm from the measured transmittance and reflectance was 1.6% right after the thin film was formed, while on the other hand it was reduced to be as much as 0.2% after the thin film was irradiated by the low-pressure mercury lamp. From the above, it can be understood that if an optical element is irradiated after a thin film has been formed onto it, its optical absorption factor will be reduced. In other words, irradiation of an optical element including CaF$_2$ by a low-pressure mercury lamp, which was damaged (with a color center) when a MgF$_2$ thin film was formed by using the vacuum disposition, and whose transmittance lowered, is effective to recovery of its transmittance.

EXAMPLE 3

Similar to the second embodiment, a thin film of $MgF_2$ with a thickness of about 100 nm was first formed by vaporizing the $MgF_2$ while heating it with an electron beam, onto a flat $CaF_2$ substrate with a thickness of 2 mm, both of whose surfaces are polished to be used as the substrate 100. As soon as the thin film was formed, the transmittance and reflectance of this optical element was measured using a spectrophotometer to calculate its optical absorption factor.

Next, this optical element was irradiated by KrF excimer laser for 30 minutes (where it is assumed that the irradiating section 30 of the optical irradiation apparatus 1 is KrF excimer laser). After this optical element was irradiated by the KrF excimer laser, its transmittance and reflectance was measured again by using the spectrophotometer to calculate its optical absorption factor.

The calculation result of the optical absorption factor at the wavelength of 248 nm from the measured transmittance and reflectance was 1.6% right after the thin film was formed, while on the other hand it was reduced to be as much as 0.1% after the thin film was irradiated by KrF excimer laser. From the above, it can be understood that if an optical element is irradiated by KrF excimer laser after a thin film was formed onto it, its optical absorption factor will be reduced further than when it is irradiated by the low-pressure mercury lamp. In other words, irradiation of an optical element including $CaF_2$ by the KrF excimer laser, which was damaged (with a color center) when a $MgF_2$ thin film was formed using vacuum disposition, and whose transmittance lowered, is more effective than by being irradiated by the low-pressure mercury lamp in recovering its transmittance.

EXAMPLE 4

Similar to embodiment 1, an alumina thin film with a thickness of about 100 nm was first formed by the sputtering method onto a flat $MgF_2$ substrate with a thickness of 2 mm, both of whose surfaces are polished to be used as the substrate 100. As soon as the thin film was formed, the transmittance and reflectance of this optical element was measured using a spectrophotometer to calculate its optical absorption factor.

Next, this optical element was irradiated by ArF excimer laser for one hour (where it is assumed that the irradiating section 30 of the optical irradiation apparatus 1 is ArF excimer laser). After this optical element was irradiated by ArF excimer laser, its transmittance and reflectance was measured again by using the spectrophotometer to calculate its optical absorption factor.

The calculation result of the optical absorption factor at the wavelength of 193 nm from the measured transmittance and reflectance was 1.5% right after the thin film was formed, while on the other hand it was reduced to be as much as 0.5% after the thin film was irradiated by ArF excimer laser. From the above, it can be understood that if an optical element is irradiated by ArF excimer laser after a thin film was formed onto it, its optical absorption factor will be reduced. In other words, irradiation of an optical element including magnesium fluoride by ArF excimer laser, which was damaged (with a color center) when an alumina thin film was formed using sputtering, and whose transmittance lowered, is effective to recovery of its transmittance.

EXAMPLE 5

Similar to embodiment 1, an anti-reflection film for a wavelength of 193 nm was first formed by the sputtering method onto both sides of a flat $CaF_2$ substrate with a thickness of 2 mm, both of whose surfaces are polished to be used as the substrate 100. As soon as the anti-reflection film was formed, the transmittance and reflectance of this optical element was measured using a spectrophotometer to calculate its optical absorption factor.

Next, this optical element was irradiated by a low pressure mercury lamp for one hour (where it is assumed that the irradiating section 30 of the optical irradiation apparatus 1 is a low-pressure mercury lamp). After the low-pressure mercury lamp was irradiated, the transmittance and reflectance of this optical element was measured again by using the spectrophotometer to calculate its optical absorption factor.

Figure 2:
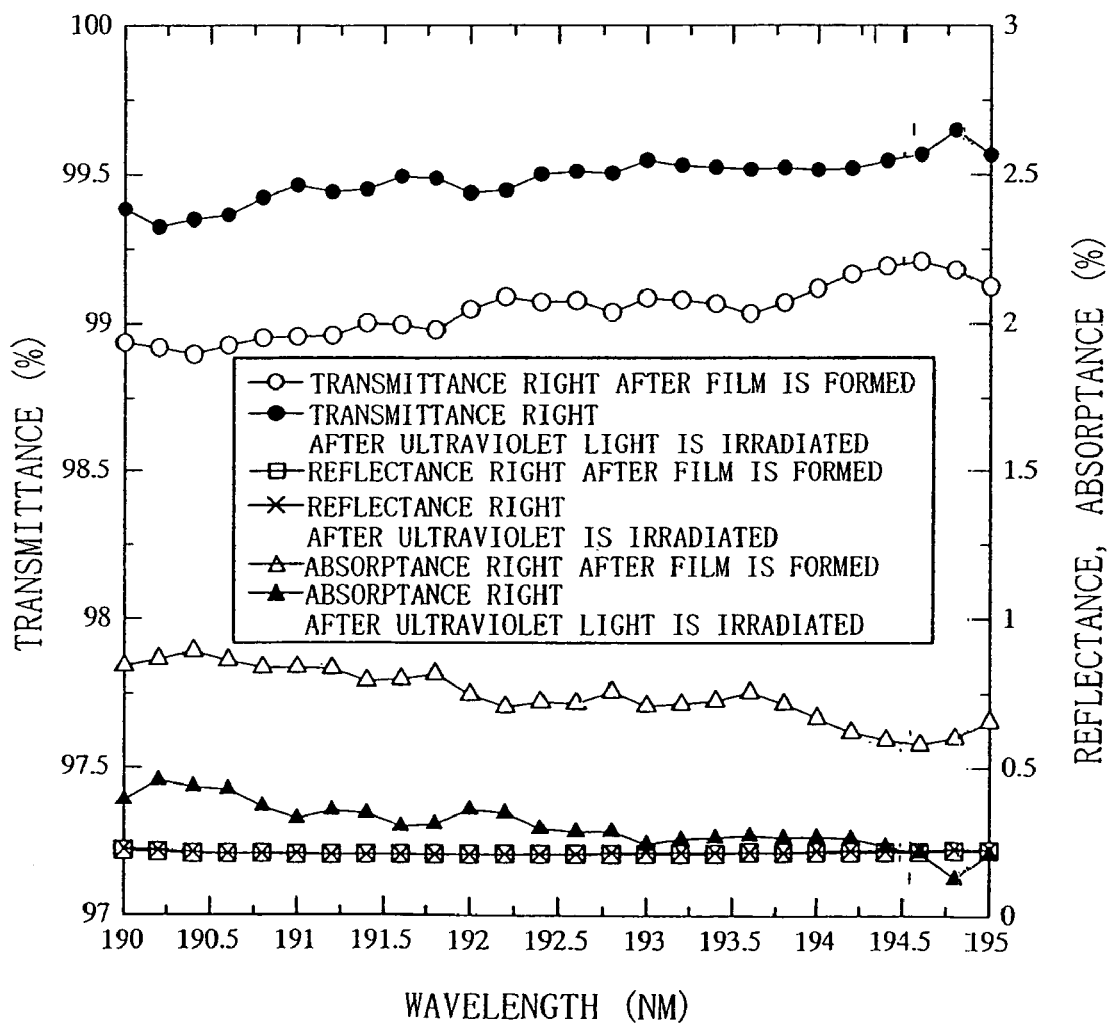
FIG. 2 is a graph showing optical characteristics of an optical element when an optical irradiation is performed to wavelengths of incident light.

The measured transmittance and reflectance, and results of the calculated optical absorptions are shown in FIG. 2. FIG. 2 adopts the axis of abscissa as the wavelength of light incident upon the optical element, the left-side axis of abscissa as the transmittance of the optical element, and the right-side axis of abscissa as the reflectance and absorption factors of the optical element so that the optical characteristics of the optical element right after the anti-reflection film is formed and the low pressure mercury lamp is irradiated may be shown.

Referring to FIG. 2, if the low-pressure mercury lamp is irradiated, the reflectance of the optical element hardly changes, but the transmittance increases by a large margin. From the above, it is understood that if the low-pressure mercury lamp is irradiated to an optical element after the anti-reflection film has been formed onto it, the optical absorption factor will be decreased. In other words, it is understood that irradiation of an optical element by a low-pressure mercury lamp, which includes calcium fluoride, and was damaged (a color center was produced) when an anti-reflection film was formed onto both sides of the substrate by the sputtering method, and whose transmittance, therefore, lowered, is effective in recovering its transmittance.

Figure 3:
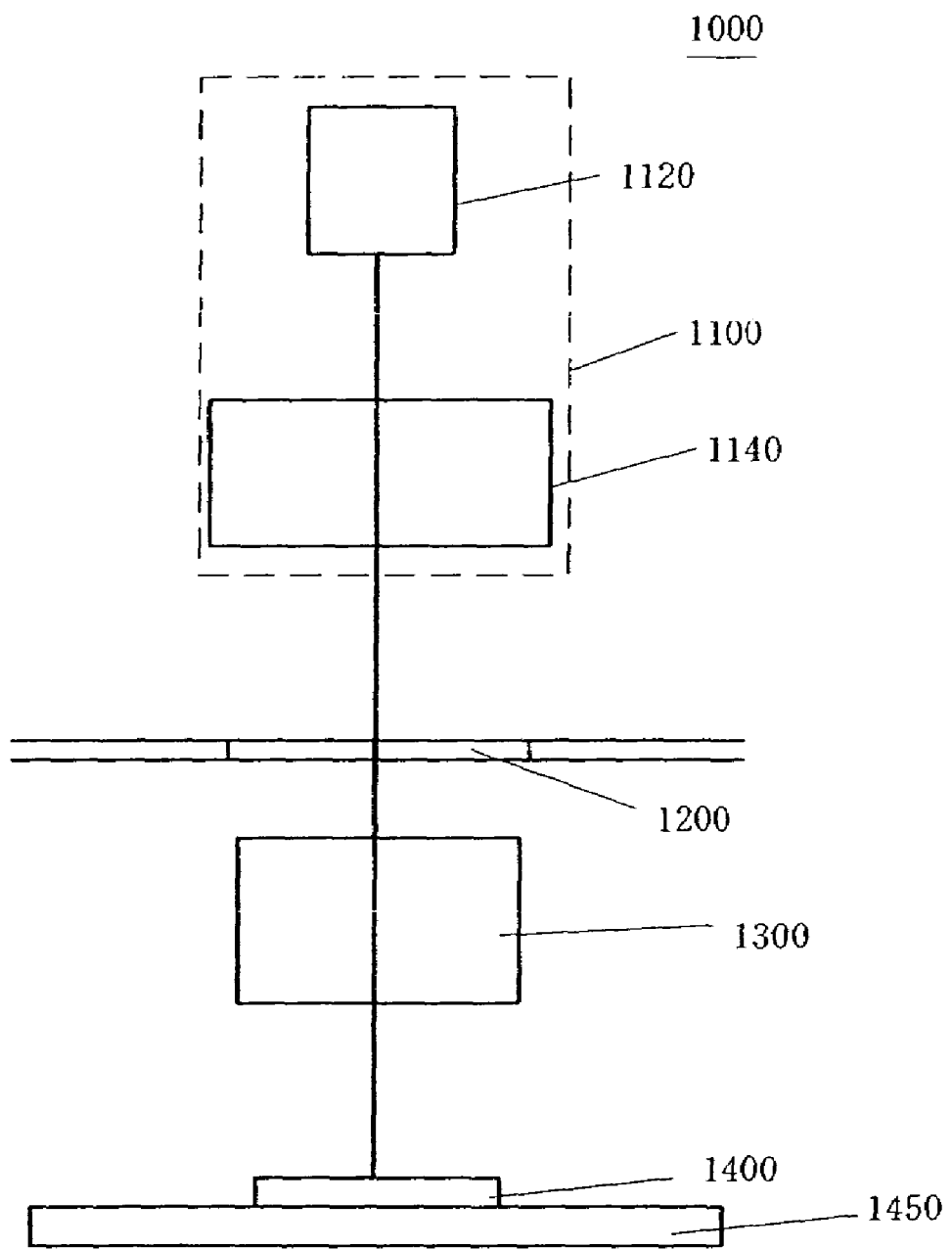
FIG. 3 is a schematic block diagram of an exposure apparatus as one aspect of the present invention.

Referring to FIG. 3, a description will be given below of an exposure apparatus 1000 as an exemplified aspect of the present invention. Here, FIG. 3 is a schematic block diagram of the exposure apparatus 1000. As shown in FIG. 3, the exposure apparatus 1000 includes an illumination apparatus 1100 that illuminates a mask or reticle (these terms are used interchangeably in the present application) onto which a circuit pattern is formed, a stage 1450 that supports a substrate, and a projection optical system 1300 that projects the illuminated circuit pattern onto the substrate 1400.

The exposure apparatus 1000 is a projection exposure apparatus that exposes onto the substrate 1400 a circuit pattern created on the mask 1200, e.g., in a step-and-repeat or a step-and-scan manner. Such an exposure apparatus is suitably applicable to a lithography process below submicron or quarter-micron, and a description will be given below of this embodiment taking a step-and-scan exposure apparatus (which is also called "a scanner") as an example. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The illumination apparatus 1100, which illuminates the mask 1200 onto which a circuit pattern to be transferred is created, includes a light source section 1120 and an illumination optical system 1140.

The light source section 1120 uses, e.g., laser as a light source. Laser to be used is ArF excimer laser with a wavelength of about 193 nm, KrF excimer laser with a wavelength of about 248 nm, $F_2$ excimer laser with a wavelength of about 153 nm, etc. A kind of laser is not limited to excimer laser. For example, YAG laser can be used, and the number of laser units is not limited. For example, if two units of solid laser that operate independently are used, no coherence between these solid laser units exists, and thus, speckles arising from the coherence will be reduced considerably. Further, in order to reduce speckles, it would be advisable to oscillate an optical system in a straight or rotating manner. Moreover, when laser is used for the light source section 1120, it is advisable to use a beam shaping system that reshapes a parallel beam from a laser light source into a desired beam shape and an incoherently turning optical system that turns a coherent laser beam into an incoherent one. A light source applicable to the light source section 1120 is not limited to laser, but may use one or more lamps such as a mercury lamp, xenon lamp, etc.

The illumination optical system 1140 is an optical system that illuminates the mask 1200, and includes a lens, a mirror, a light integrator, a stop, etc. For example, they are arranged in the order of a condenser lens, a fly-eye lens, an aperture stop, a condenser lens, a slit, and an image-forming optical system. The illumination optical system 1140 can use any light whether it is on-axial or off-axial light. The light integrator may include a fly-eye lens or an integrator formed by stacking two sets of cylindrical lens array substrates (or lenticular lenses), and may be replaced with an optical rod or a diffractive element. For such an optical element as a lens for the illumination optical system 1140, an optical system can be used that has been irradiated by the optical irradiation apparatus 1 of the present invention.

The mask 1200 is made, e.g., of quartz, on which a circuit pattern (or an image) to be transferred is created, and is supported and driven by a mask stage (not shown). Diffracted light emitted from the mask 1200 passes the projection optical system 1300, thus and then is projected onto the substrate 1400. The substrate 1400 is an object to be exposed such as a wafer, liquid crystal substrate, and the like, onto which resist is applied. The mask 1200 and the substrate 1400 are located in an optically conjugate relationship. When the exposure apparatus 1000 is a scanner, it scans the mask 1200 and the substrate 1400 to transfer a pattern on the mask 1200 onto the substrate 1400. When it is a stepper, the mask 1200 and the substrate 1400 are kept stationary for exposure.

The projection optical system 1300 may use an optical system solely including a plurality of lens elements, an optical system including a plurality of lens elements and at least one concave mirror (a catadioptric optical system), an optical system including a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit. For such an optical element as a lens for the projection optical system 1300, an optical system can be used that was irradiated by the optical irradiation apparatus 1 of the present invention.

Photo-resist is applied onto the substrate 1400. A photo-resist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo-resist and a base (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

The stage 1450 supports the substrate 1400. The stage 1450 may use any structure known in the art, and thus, a detailed description of its structure and operations is omitted here. For example, the stage 1450 uses a linear motor to move the substrate 1400 in X-Y directions. The mask 1200 and substrate 1400 are, for example, scanned synchronously, and the positions of the stage 1450 and a mask stage (not shown) are monitored, for example, by a laser interferometer and the like, so that both are driven at a constant speed ratio. The stage 1450 is installed on a stage surface substrate supported on the floor and the like, for example, via a damper, and the mask stage and the projection optical system 1300 are installed on a body tube surface substrate (not shown) supported, for example, via a damper to the base-frame placed on the floor.

In exposure operation, beams emitted from the light source section 1120, e.g., Koehler-illuminates the mask 1200 via the illumination optical system 1140. Light that passes through the mask 1200 and reflects the mask pattern is imaged onto the substrate 1400 by the projection optical system 1300. The illumination optical system 1140 and the projection optical system 1300, which the exposure apparatus 1000 uses, include optical elements such as lenses for the illumination apparatus 1140, etc. that are irradiated by the optical irradiation apparatus 1 of this invention, and transmit ultraviolet light, far ultraviolet light, and vacuum violet light with high transmittance, thus providing devices (such as semiconductor devices, LCD devices, photographing devices (such as CCDs, etc.), thin film magnetic heads, and the like) with high throughput and economical efficiency.

Figure 4:
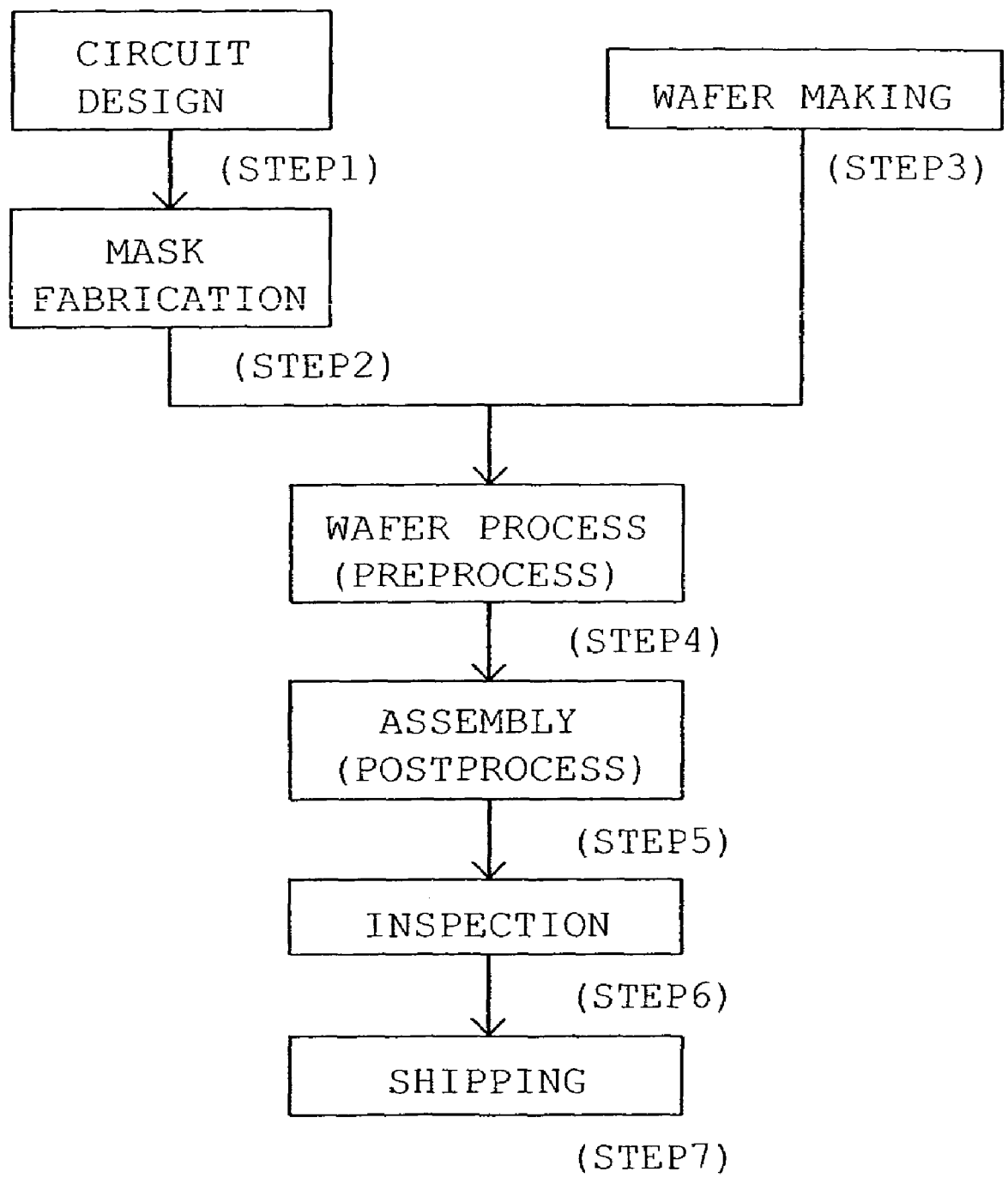
FIG. 4 is a flowchart for explaining a device fabrication method using the exposure apparatus of the present invention.
Figure 5:
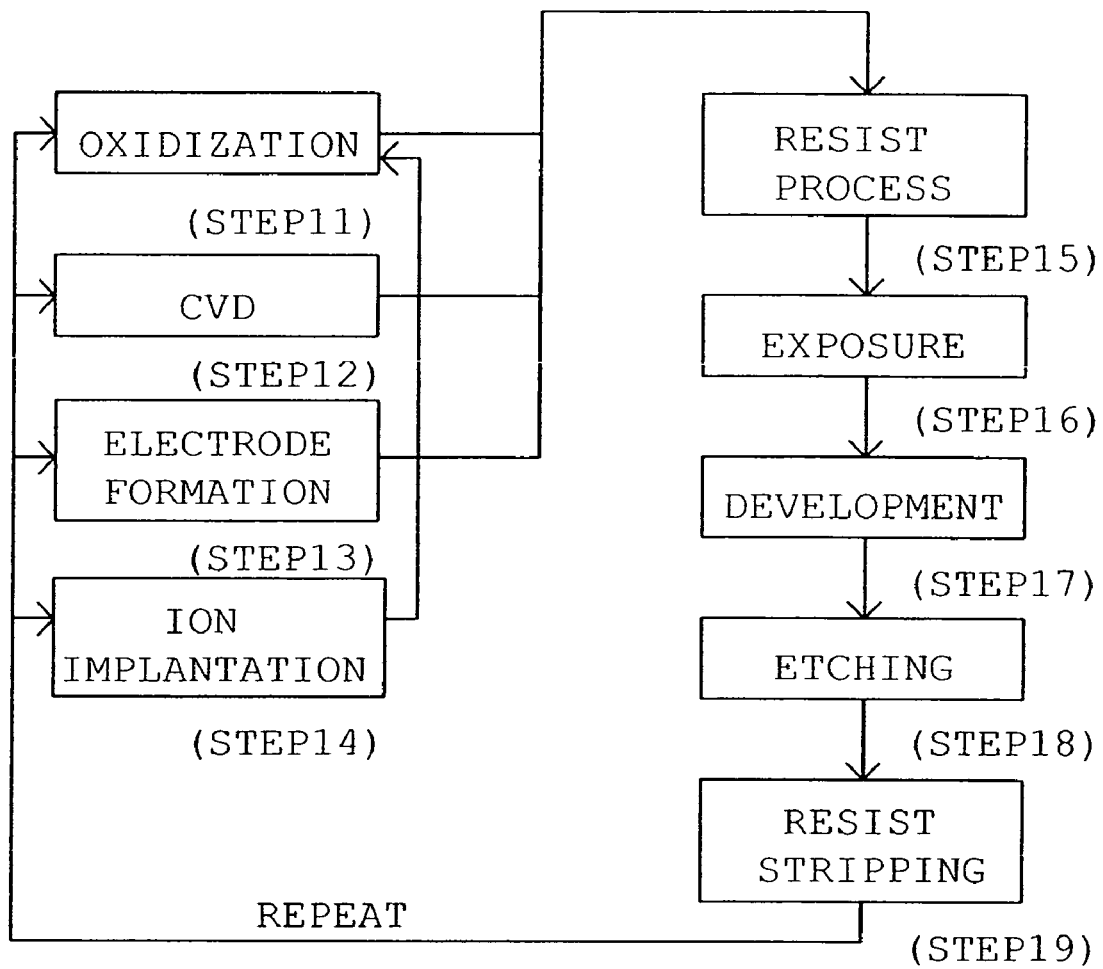
FIG. 5 is a detailed flowchart for Step 4 shown in FIG. 4.

Referring to FIGS. 4 and 5, a description will now be given of an embodiment of a device fabrication method using the above mentioned exposure apparatus 1000. FIG. 4 is a flowchart for explaining how to fabricate devices (i.e., semiconductor chips such as IC and LSI, LCDs, CCDs, and the like). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 300 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer. Use of the fabrication method in this embodiment helps fabricate higher-quality devices than ever.

Further, the present invention is not limited to these preferred embodiments and various variations and modifications may be made without departing from the spirit and scope of the present invention.

Use of the optical element fabrication method, the optical element, the exposure apparatus and the device fabrication method of the present invention makes it possible to decrease optical absorption arising when a thin film is formed onto a substrate including fluoride crystals, thus providing optical elements with excellent optical characteristics. Further, a device fabrication method using an exposure apparatus with such an optical element can fabricate high-quality devices.

What is claimed is:

1. An optical element fabrication method comprising the steps of:
    forming a thin film onto a substrate including an ionic crystal; and
    eliminating a color center produced in said forming step by irradiating light from a mercury lamp to the substrate, thereby decreasing an optical absorption during said forming step,
    wherein said mercury lamp has main light emissions at 184.9 nm and 253.7 nm.

2. A fabrication method according to claim 1, wherein the substrate contains fluoride.

3. A fabrication method according to claim 1, wherein the thin film contains fluoride.

4. A fabrication method according to claim 2, wherein the fluoride is calcium fluoride.

5. A fabrication method according to claim 1, wherein said irradiating step sets light intensity of the light to be 0.02 mJ/cm$^2$ or higher.

6. A fabrication method according to claim 1, wherein said irradiating step sets an irradiation time of the light to be five minutes or longer.

7. A fabrication method according to claim 1, wherein said irradiating step sets a product between light intensity of the light and irradiation time of the light to be 0.1 mJ·minute/cm$^2$ or higher.

8. A fabrication method according to claim 1, wherein said forming step forms the thin film in an atmosphere including plasma.

9. A fabrication method according to claim 1, wherein said forming step uses electron beam heating to form the thin film.

10. An optical element fabrication method comprising the steps of:
    forming a thin film onto a substrate including an ionic crystal; and
    eliminating a color center produced in said forming step by giving energy in the form of UV radiation from a mercury lamp to the substrate, thereby decreasing an optical absorption during said forming step,
    wherein said mercury lamp has main light emissions at 184.9 nm and 253.7 nm.

11. A device fabrication method comprising the steps of:
    exposing the object to be exposed by using an exposure apparatus that irradiates exposure light to the object via an optical system including an optical element, and exposes the object, wherein the optical element is fabricated by a fabrication method comprising the steps of forming a thin film onto a substrate including an ionic crystal, and eliminating a color center produced in said forming step by irradiating light from a mercury lamp to the substrate; and
    performing a predetermined process for the exposed object, thereby decreasing an optical absorption during said forming step,
    wherein said mercury lamp has main light emissions at 184.9 nm and 253.7 nm.

* * * * *